US012813197B2

(12) United States Patent
Kawakami et al.

(10) Patent No.: US 12,813,197 B2
(45) Date of Patent: Nov. 24, 2026

(54) SUBSTRATE TREATMENT METHOD, SUBSTRATE TREATMENT APPARATUS, AND COMPUTER STORAGE MEDIUM

(71) Applicant: Tokyo Electron Limited, Tokyo (JP)

(72) Inventors: Shinichiro Kawakami, Koshi City (JP); Kosuke Yoshihara, Koshi City (JP); Satoru Shimura, Koshi City (JP); Yuhei Kuwahara, Koshi City (JP); Tomoya Onitsuka, Koshi City (JP); Soichiro Okada, Leuven (BE); Tetsunari Furusho, Koshi City (JP)

(73) Assignee: Tokyo Electron Limited, Tokyo (JP)

( * ) Notice: Subject to any disclaimer, the term of this patent is extended or adjusted under 35 U.S.C. 154(b) by 566 days.

(21) Appl. No.: 18/473,459

(22) Filed: Sep. 25, 2023

(65) Prior Publication Data

US 2024/0120217 A1 Apr. 11, 2024

(30) Foreign Application Priority Data

Oct. 6, 2022 (JP) ................................ 2022-161845

(51) Int. Cl.
*H10P 72/00* (2026.01)
*H10P 76/00* (2026.01)

(52) U.S. Cl.
CPC .......... *H10P 72/0434* (2026.01); *H10P 76/00* (2026.01)

(58) Field of Classification Search
CPC .. H10P 72/0434; H10P 76/00; H10P 72/0458; H10P 72/0602; H10P 72/0432; H10P 72/3302; H10P 76/2041; G03F 7/38; G03F 7/0042; G03F 7/3021
See application file for complete search history.

(56) References Cited

U.S. PATENT DOCUMENTS

2022/0163889 A1* 5/2022 Chen ..................... G03F 7/0042
2023/0176484 A1 6/2023 Kawakami et al.

FOREIGN PATENT DOCUMENTS

JP 2021-019178 A 2/2021
JP 2024-532665 A 9/2024
WO 2021/193202 A1 9/2021
WO 2023/009336 A1 2/2023

* cited by examiner

*Primary Examiner* — Stewart A Fraser
(74) *Attorney, Agent, or Firm* — Posz Law Group, PLC

(57) ABSTRACT

A substrate treatment method includes: performing a first heat treatment on a substrate on which a coating film of a metal-containing resist has been formed and subjected to an exposure treatment, to form the metal-containing resist into a precursor in an exposed region of the coating film; thereafter, performing a second heat treatment on the substrate to condense the metal-containing resist formed into the precursor in the exposed region of the coating film; and thereafter, performing a developing treatment on the substrate.

10 Claims, 12 Drawing Sheets

SUBSTRATE TREATMENT METHOD, SUBSTRATE TREATMENT APPARATUS, AND COMPUTER STORAGE MEDIUM

CROSS REFERENCE TO RELATED APPLICATIONS

This application is based upon and claims the benefit of priority of the prior Japanese Patent Application No. 2022-161845, filed in Japan on Oct. 6, 2022, the entire contents of which are incorporated herein by reference.

TECHNICAL FIELD

This disclosure relates to a substrate treatment method, a substrate treatment apparatus, and a computer storage medium.

BACKGROUND

Japanese Laid-open Patent Publication No. 2021-19178 discloses a method of performing a thermal treatment on a substrate on which a coating film of a metal-containing resist has been formed and the coating film has been subjected to an exposure treatment, by supporting and heating it on a hot plate.

SUMMARY

An aspect of this disclosure is a substrate treatment method including: performing a first heat treatment on a substrate on which a coating film of a metal-containing resist has been formed and subjected to an exposure treatment, to form the metal-containing resist into a precursor in an exposed region of the coating film; thereafter, performing a second heat treatment on the substrate to condense the metal-containing resist formed into the precursor in the exposed region of the coating film; and thereafter, performing a developing treatment on the substrate.

DETAILED DESCRIPTION

In a manufacturing process of a semiconductor device or the like, predetermined treatments for forming a resist pattern on a semiconductor wafer (hereinafter, referred to as a "wafer") are performed. The predetermined treatments include, for example, a resist coating treatment of supplying a resist solution onto the wafer to form a resist film, an exposure treatment of exposing the resist film, a PEB (Post Exposure Bake) treatment of heating so as to promote the chemical reaction in the resist film after exposure, a developing treatment of developing the exposed resist film, and so on.

In recent years, a metal-containing resist is sometimes used as a resist in place of the chemically amplified resist. However, in the case of using the metal-containing resist, a resist pattern excellent in uniformity of dimensions of micro regions, namely, a resist pattern having small roughness cannot be formed in some cases. Besides, the roughness can be made smaller by making the temperature of the wafer during the PEB treatment low, as compared with the case of making the temperature of the wafer high, but the exposure sensitivity (hereinafter, referred to as sensitivity) of a coating film of the metal-containing resist decreases.

Hence, the technique according to this disclosure improves the roughness of a resist pattern of a metal-containing resist while suppressing a decrease in sensitivity of a coating film of the metal-containing resist. Hereinafter, a substrate treatment method and a substrate treatment apparatus according to an embodiment will be explained with reference to the drawings. Note that, in this description and the drawings, components having substantially the same functional configurations are denoted by the same reference signs to omit duplicate explanations.

<Coating and Developing Treatment Apparatus>

Figure 1:
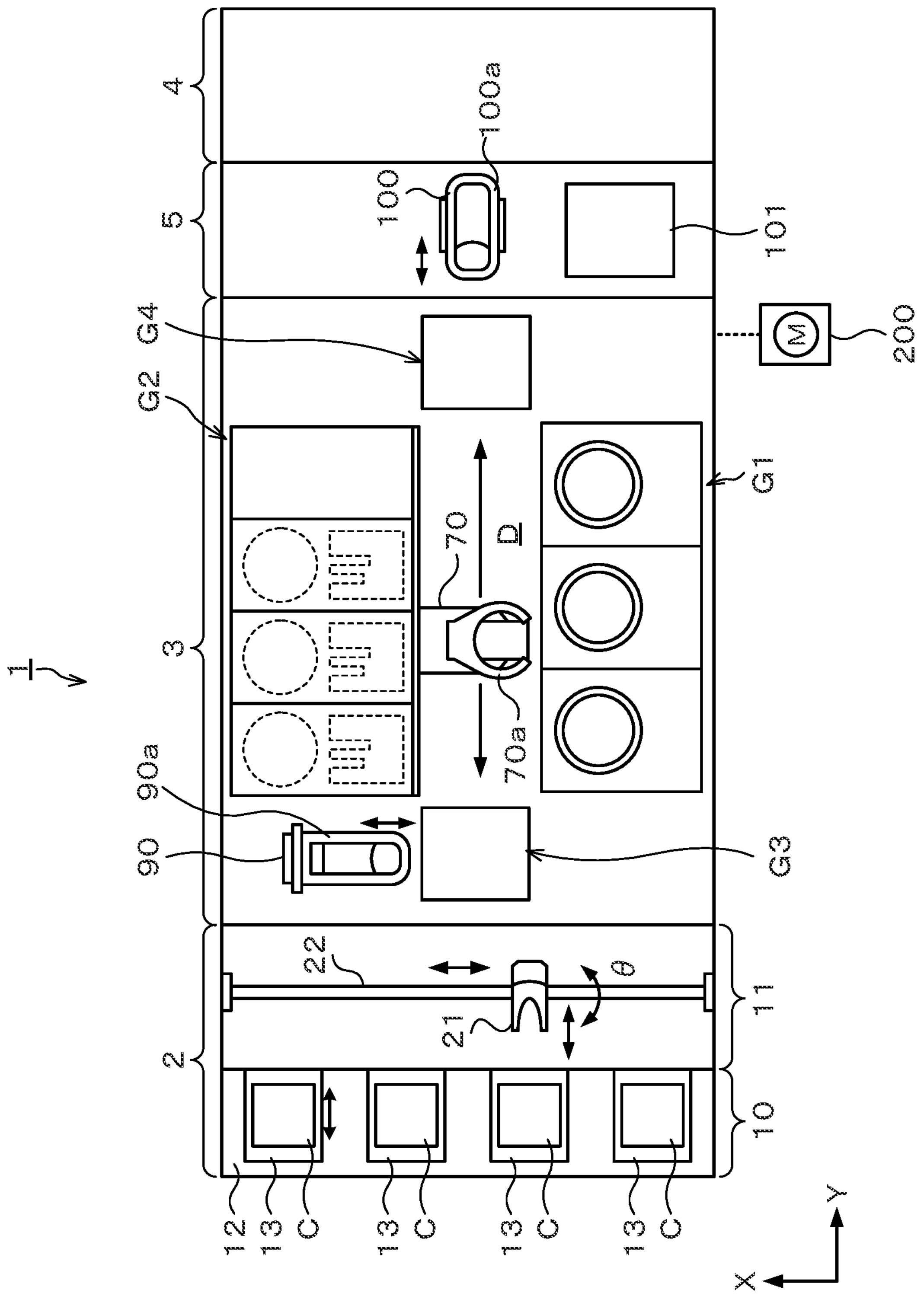
FIG. 1 is an explanatory view illustrating the outline of an internal configuration of a coating and developing treatment apparatus as a substrate treatment apparatus according to an embodiment.
Figure 2:
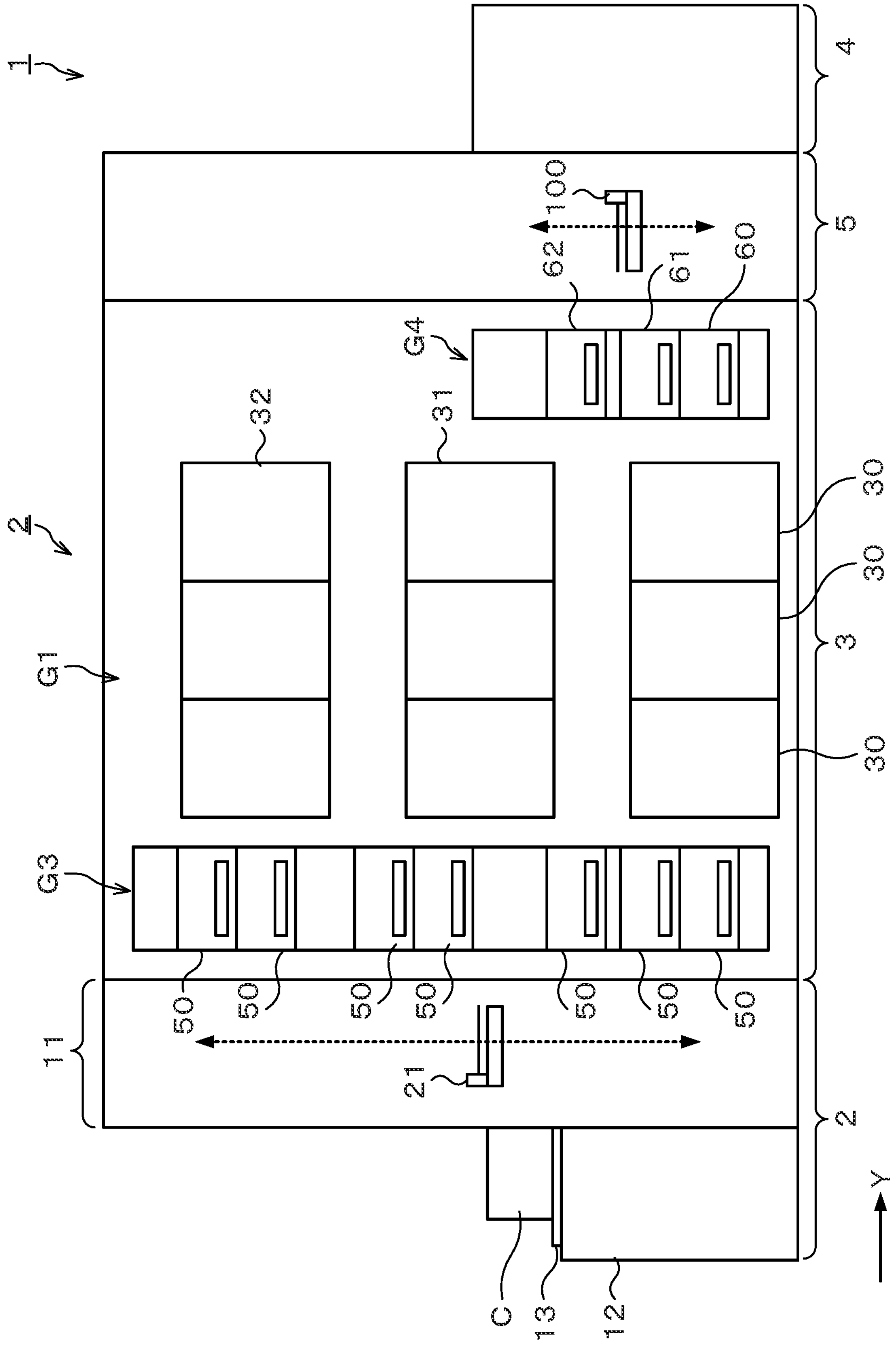
FIG. 2 is a view illustrating the outline of the internal configuration on the front side of the coating and developing treatment apparatus.
Figure 3:
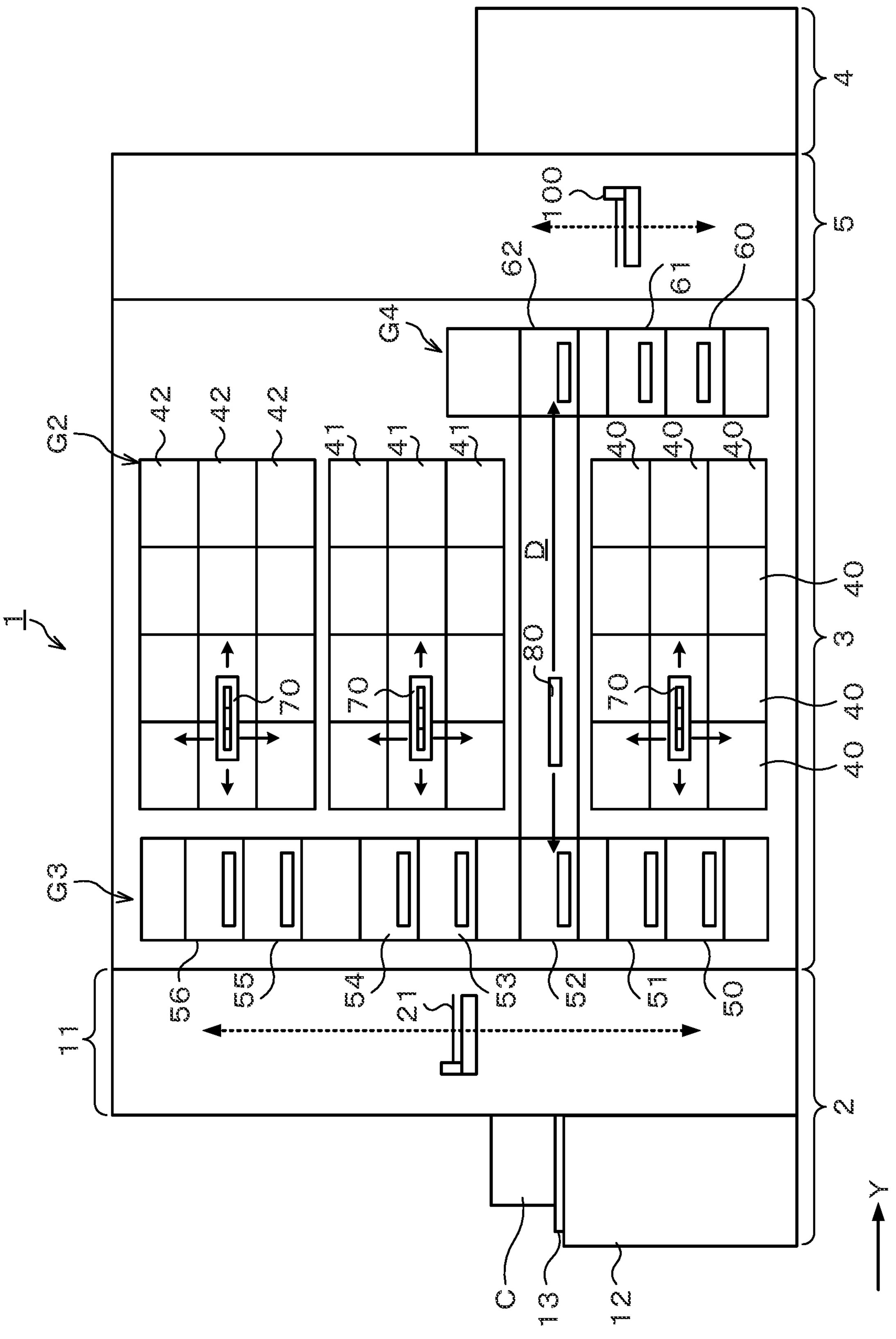
FIG. 3 is a view illustrating the outline of the internal configuration on the rear side of the coating and developing treatment apparatus.

FIG. 1 is an explanatory view illustrating the outline of an internal configuration of a coating and developing treatment apparatus 1 as a substrate treatment apparatus according to an embodiment. FIG. 2 and FIG. 3 are views illustrating the outline of the internal configuration on the front side and the rear side of the coating and developing treatment apparatus 1, respectively.

The coating and developing treatment apparatus 1 forms a resist pattern on the wafer W as a substrate using a negative type metal-containing resist being a resist containing metal. The metal-containing resist used in the coating and developing treatment apparatus 1 is, more specifically, the one also containing oxygen. Note that the metal contained in the metal-containing resist may be any metal and is, for example, tin.

The coating and developing treatment apparatus 1 has, as illustrated in FIG. 1 to FIG. 3, a cassette station 2 into/out of which a cassette C being a container capable of housing a plurality of wafers W is transferred, and a treatment station 3 including a plurality of various treatment units which perform the predetermined treatments such as the resist coating treatment. The coating and developing treatment apparatus 1 further has an interface station 5 which delivers the wafer W between an exposure apparatus 4 adjacent to the coating and developing treatment apparatus 1 and the treatment station 3. The coating and developing treatment apparatus 1 has a configuration in which the cassette station 2, the treatment station 3, and the interface station 5 are integrally connected.

The cassette station 2 is divided into, for example, a cassette transfer in/out section 10 and a wafer transfer section 11. The cassette transfer-in/out section 10 is provided, for example, at an end portion on a Y-direction negative direction (left direction in FIG. 1) side in the coating and developing treatment apparatus 1. In the cassette transfer-in/out section 10, a cassette stage 12 is provided. On the cassette stage 12, a plurality of, for example, four stage plates 13 are provided. The stage plates 13 are provided side by side in a row in an X-direction being a horizontal direction (an up-down direction in FIG. 1). On the stage plates 13, cassettes C can be mounted when the cassettes C are transferred in/out from/to the outside of the coating and developing treatment apparatus 1.

In the wafer transfer section 11, a transfer unit 20 is provided which transfers the wafer W. The transfer unit 20 is configured to be movable on a transfer path 21 extending in the X-direction. The transfer unit 20 is movable also in the up-down direction and around a vertical axis (in a θ-direction), and can transfer the wafer W between the cassette C on each of the stage plates 13 and a later-explained delivery unit in a third block G3 in the treatment station 3.

In the treatment station 3, a plurality of, for example, first to fourth four blocks G1, G2, G3, G4 each including various units are provided. For example, the first block G1 is provided on the front side (an X-direction negative direction side in FIG. 1) in the treatment station 3, and the second block G2 is provided on the rear side (an X-direction positive direction side in FIG. 1) in the treatment station 3. Further, the third block G3 is provided on the cassette station 2 side (a Y-direction negative direction side in FIG. 1) in the treatment station 3, and the fourth block G4 is provided on the interface station side (a Y-direction positive direction side in FIG. 1) in the treatment station 3.

In the first block G1, as illustrated in FIG. 2, a plurality of solution treatment units, for example, developing treatment units 30 as developing parts and resist coating units 32 as resist coating parts are arranged in this order from the bottom. The developing treatment unit 30 performs a developing treatment on the wafer W. A lower anti-reflection film forming unit 31 forms an anti-reflection film (hereinafter, referred to as a "lower anti-reflection film") on a lower layer of the metal-containing resist film on the wafer W. The resist coating unit 32 applies a metal-containing resist to the wafer W to form a coating film of the metal-containing resist, namely, a metal-containing resist film.

The developing treatment unit 30, the lower anti-reflection film forming unit 31, and the resist coating unit 32 are provided, for example, three each arranged side by side in the horizontal direction. Note that the numbers and the arrangements of the developing treatment units 30, the lower anti-reflection film forming units 31, and the resist coating units 32 can also be arbitrarily selected.

In each of the developing treatment unit 30, the lower anti-reflection film forming unit 31, and the resist coating unit 32, a predetermined treatment solution is applied onto the wafer W, for example, by a spin coating method. In the spin coating method, the treatment solution is discharged onto the wafer W, for example, from a discharge nozzle and the wafer W is rotated to diffuse the treatment solution over a surface of the wafer W.

In the first block G1, an upper anti-reflection film forming unit which forms an anti-reflection film on an upper layer of the metal-containing resist film on the wafer W may further be arranged.

For example, in the second block G2, thermal treatment units 40 as heating parts and cooling parts, hydrophobic treatment units 41, and edge exposure units 42 are provided one above the other in the up-down direction and side by side in the horizontal direction as illustrated in FIG. 3. The thermal treatment module 40 performs thermal treatments such as a heat treatment and a cooling treatment on the substrate W. The hydrophobic treatment unit 41 performs a hydrophobic treatment on the wafer W to enhance the fixation between the metal-containing resist and the wafer W. The edge exposure unit 42 exposes an edge portion of the resist film on the wafer W. The numbers and the arrangements of the thermal treatment units 40, the hydrophobic treatment units 41, and the edge exposure units 42 can also be arbitrarily selected. Note that the thermal treatment unit 40 performs a pre-baking treatment (hereinafter, referred to as a "PAB treatment") being a heat treatment on the wafer W after the resist coating treatment, a later-explained first heat treatment, a PEB treatment as a later-explained second heat treatment, a post-baking treatment (hereinafter, referred to as a "POST treatment") being a heat treatment on the wafer W after the developing treatment, or the like.

In the third block G3, for example, a plurality of delivery units 50, 51, 52, 53, 54, 55, 56 are provided in order from the bottom. Further, in the fourth block G4, a plurality of delivery units 60, 61, 62 are provided in order from the bottom.

As illustrated in FIG. 1, in a region surrounded by the first block G1 to the fourth block G4, a wafer transfer region D is formed. In the wafer transfer region D, for example, a wafer transfer unit 70 is arranged as a substrate transfer unit for transferring the wafer W.

The wafer transfer unit 70 has a transfer arm 70*a* movable, for example, in the Y-direction, the θ-direction, and the up-down direction. The wafer transfer unit 70 can move the transfer arm 70*a* holding the wafer W in the wafer transfer region D and transfer the wafer W to predetermined apparatuses in the first block G1, the second block G2, the third block G3, and the fourth block G4 therearound. A plurality of the wafer transfer units 70 are arranged one above the other, for example, as illustrated in FIG. 3, each of which can transfer the wafer W, for example, to a predetermined unit at a similar height in the blocks G1 to G4.

Further, in the wafer transfer region D, a shuttle transfer unit 80 is provided which linearly transfers the wafer W between the third block G3 and the fourth block G4.

The shuttle transfer unit 80 can linearly move the wafer W supported thereon in the Y-direction and transfer the wafer W between the delivery unit 51 in the third block G3 and the delivery unit 60 in the fourth block G4 at similar heights.

As illustrated in FIG. 1, a transfer unit 90 is provided on the X-direction positive direction side of the third block G3.

The transfer unit 90 has a transfer arm 90*a* movable, for example, in the θ-direction and the up-down direction. The transfer unit 90 can move the transfer arm 90*a* holding the wafer W up and down to transfer the wafer W to each of the delivery units in the third block G3.

In the interface station 5, a transfer unit 100 and a delivery unit 101 are provided. The transfer unit 100 has a transfer arm 100*a* movable, for example, in the θ-direction and the up-down direction. The transfer unit 100 can transfer the wafer W to/from each of the delivery units in the fourth block G4, the delivery unit 101, and the exposure apparatus 4, while holding the wafer W by the transfer arm 100*a*.

The above coating and developing treatment apparatus 1 is provided with a controller 200 as illustrated in FIG. 1. The controller 200 is a computer including, for example, a processor such as CPU, a memory, and so on, and has a program storage (not illustrated) which stores a program including commands to be executed by the processor. The program storage stores a program including commands which control the operations of drive systems of the above various treatment units and various transfer units to perform a later-explained wafer treatment. Note that the above program may be the one recorded in a computer-readable storage medium M and installed from the storage medium M into the controller 200. The storage medium M may be a transitory storage medium or a non-transitory storage medium.

<Thermal Treatment Unit>

Figure 4:
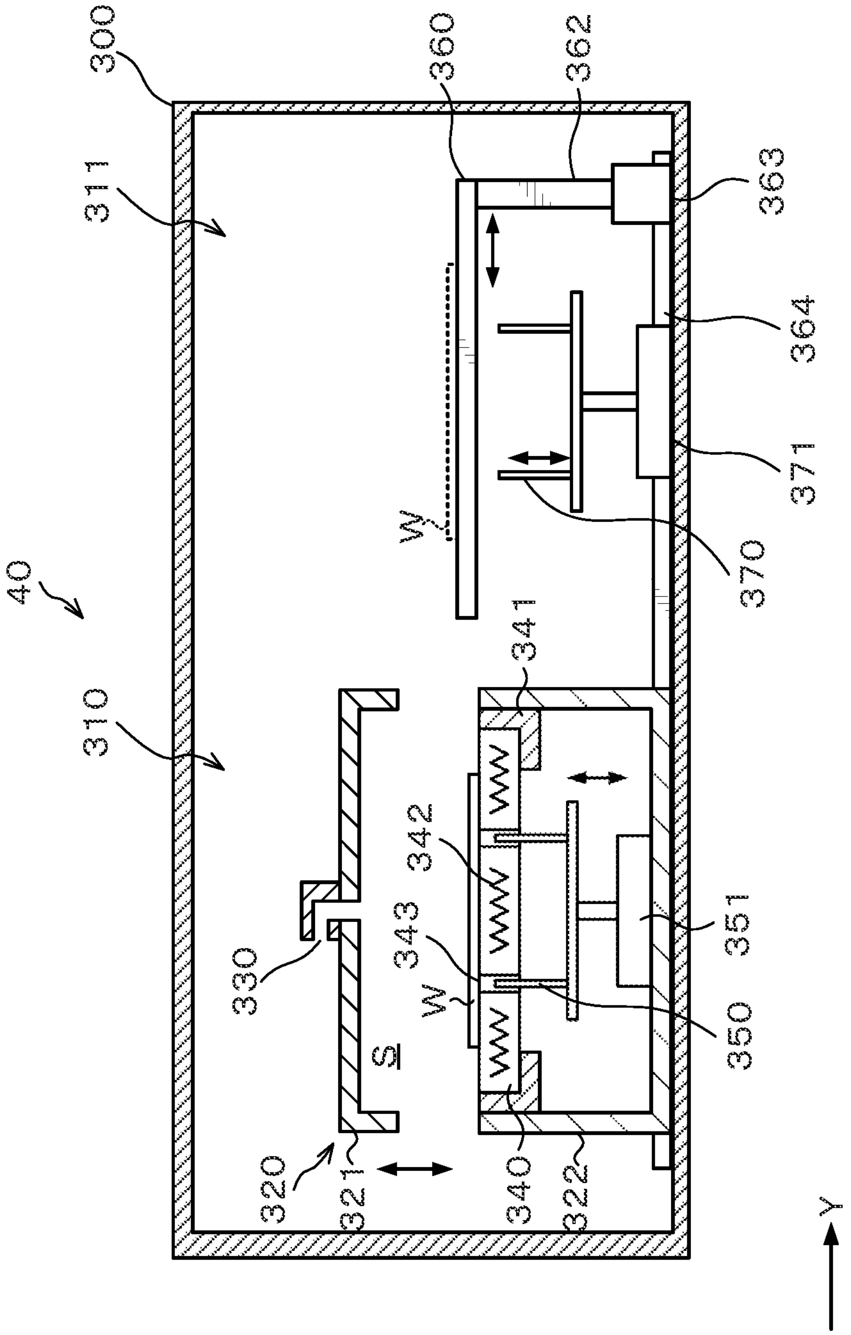
FIG. 4 is a longitudinal sectional view schematically illustrating the outline of a configuration of a thermal treatment unit used for a first heat treatment.
Figure 5:
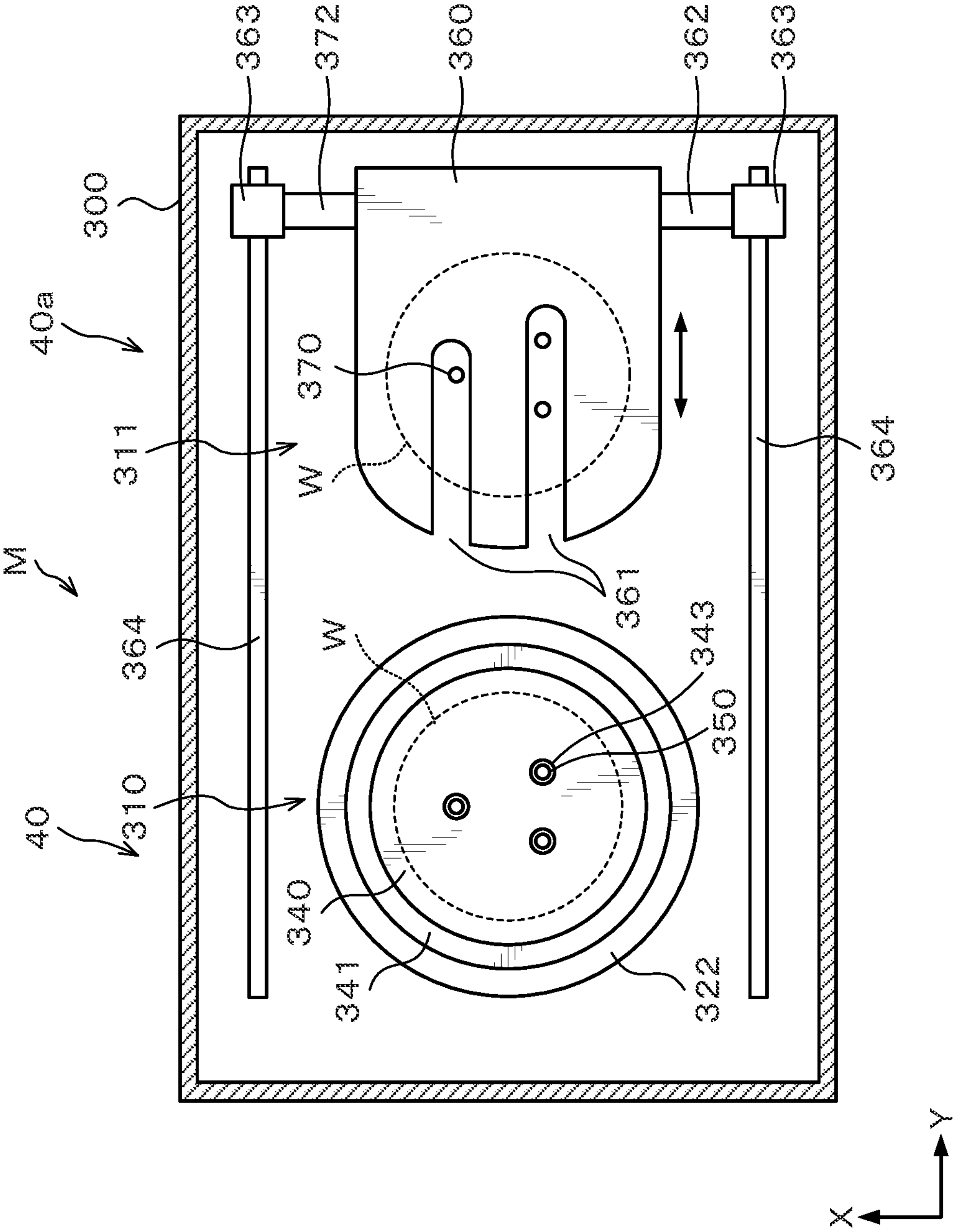
FIG. 5 is a transverse sectional view schematically illustrating the outline of the configuration of the thermal treatment unit used for the first heat treatment.

Next, a thermal treatment unit 40 used for the later-explained first heat treatment among the thermal treatment units 40 will be explained. FIG. 4 and FIG. 5 are a longitudinal sectional view and a transverse sectional view schematically illustrating the outline of a configuration of the thermal treatment unit 40 used for the first heat treatment, respectively.

The thermal treatment unit 40 in FIG. 4 and FIG. 5 is made by integrating, namely, coupling a heating part for performing a heat treatment on the wafer W and a cooling part for performing a cooling treatment on the substrate W, and has a casing 300 capable of closing the inside. At a side surface on the wafer transfer region D side of the casing 300, namely, on a later-explained cooling region 311 side, a transfer-in/out port (not illustrated) for the wafer W is formed, and an opening and closing shutter (not illustrated) is provided at the transfer-in/out port.

Inside the casing 300, a heating region 310 where the wafer W is subjected to a heat treatment and the cooling region 311 where the wafer W is subjected to a cooling treatment are provided. The heating region 310 and the cooling region 311 are arranged side by side in the Y-direction.

In the heating region 310, a chamber 320 is provided which covers a treatment space S on a later-explained hot plate 340 and houses the wafer W during the thermal treatment. The chamber 320 has an upper chamber (also referred to as a lid body) 321 which is located on the upper side and freely rises and lowers, and a lower chamber 322 which is located on the lower side and unites with the upper chamber 321 to form the treatment space S.

The upper chamber 321 has an almost cylindrical shape with a lower surface open. At a central portion of an upper surface of the upper chamber 321, an exhaust port 330 is provided. The atmosphere in the treatment space S is exhausted from the exhaust port 330.

The lower chamber 322 has an almost cylindrical shape with an upper surface open. The opening portion of the upper surface of the lower chamber 322 is provided with a hot plate 340 which supports and heats the wafer W and an annular holding member 341 which houses the hot plate 340 and holds the outer peripheral portion of the hot plate 340. The hot plate 340 has a thick and almost disk shape. Further, the hot plate 340 has, for example, a heater 342 built therein. The temperature of the hot plate 340 is controlled to be a predetermined set temperature, for example, by the controller 200.

Inside the lower chamber 322 and below the hot plate 340, for example, three raising and lowering pins 350 are provided which support the wafer W from below and raise and lower the wafer W. The raising and lowering pins 350 freely rise and lower by a raising and lowering drive mechanism 351 having a drive source such as a motor. Near the central portion of the hot plate 340, through holes 343 penetrating the hot plate 340 in a thickness direction are formed, for example, at three positions. The raising and lowering pins 350 can pass through the through holes 343 and project from the upper surface of the hot plate 340.

In the cooling region 311, a cooling plate 360 is provided which supports and cools the wafer W. The cooling plate 360 has an almost square flat plate shape, and an end surface on the hot plate 340 side is curved in an arc shape. The cooling plate 360 is formed with two slits 361 along the Y-direction. The slits 361 are formed from the end surface on the hot plate 340 side of the cooling plate 360 to the vicinity of the central portion of the cooling plate 360. The slits 361 can prevent the cooling plate 360 from interfering with the raising and lowering pins 350 in the heating region 310 and later-explained raising and lowering pins 370 in the cooling region 311. Further, the cooling plate 360 has a temperature regulation member (not illustrated) such as a flow path of cooling water, a Peltier element, or the like built therein. The temperature of the cooling plate 360 is controlled to be a predetermined temperature, for example, by the controller 200.

The cooling plate 360 is supported by a support arm 362. To the support arm 362, a drive 363 having a drive source such as a motor is attached. The drive 363 is attached to a rail 364 extending in the Y-direction. The rail 364 extends from the cooling region 311 to the heating region 310. By the drive 363, the cooling plate 360 can move along the rail 364 between an initial position in the cooling region 311 and a delivery position in the heating region 310. The cooling plate 360, the support arm 362, and the rail 364 constitute a transfer mechanism which transfers the wafer W. In other words, the cooling plate 360 constitutes the above transfer mechanism in this embodiment.

Below the cooling plate 360, for example, three raising and lowering pins 370 are provided which support the wafer W from below and raise and lower the wafer W. The raising and lowering pins 370 freely rise and lower by a raising and lowering drive mechanism 371 having a drive source such as a motor. The raising and lowering pins 370 can pass through the slits 361 and project from the upper surface of the cooling plate 360.

Note that the configuration of the thermal treatment unit 40 used for the first heat treatment and the configuration of the thermal treatment units used for the PAB treatment, the PEB treatment, and the POST treatment may be the same.

<Wafer Treatment>

Figure 6:
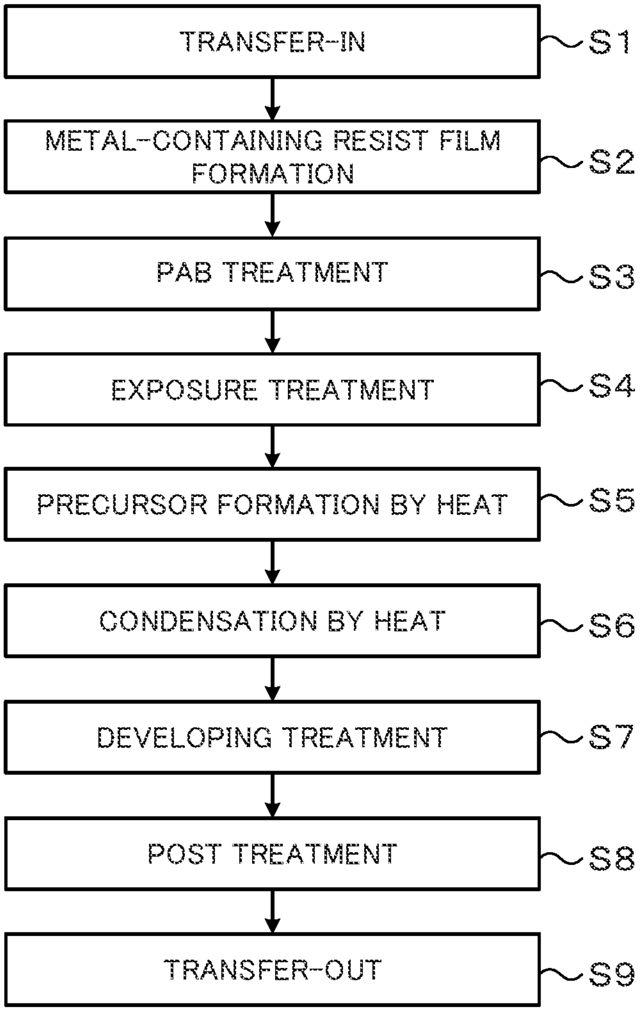
FIG. 6 is a flowchart illustrating main steps of a wafer treatment using the coating and developing treatment apparatus in FIG. 1.
Figure 7:
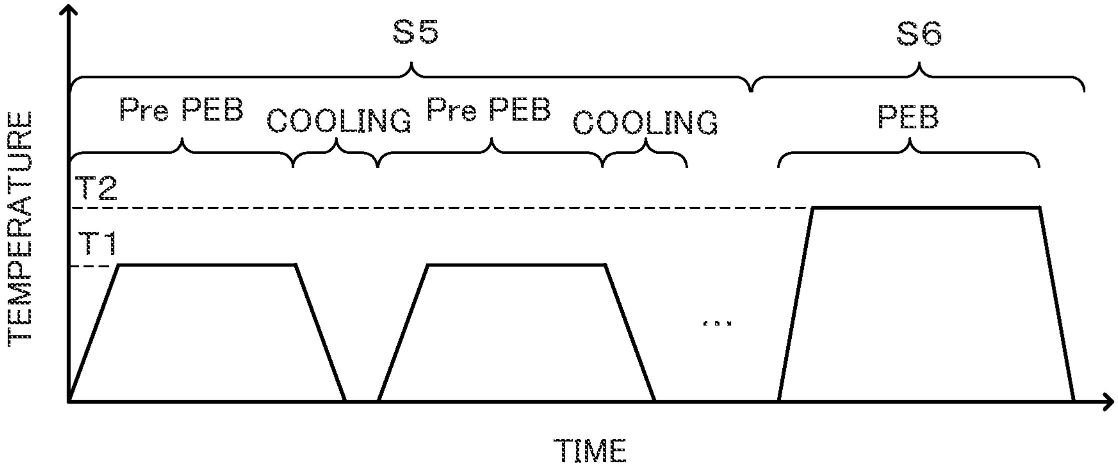
FIG. 7 is a diagram illustrating a temperature history of the wafer during a precursor formation step and a condensation step.

Next, an example of the wafer treatment using the coating and developing treatment apparatus 1 will be explained. FIG. 6 is a flowchart illustrating main steps of the wafer treatment using the coating and developing treatment apparatus 1. FIG. 7 is a diagram illustrating a temperature history of the wafer W during later-explained Step S5 and Step S6. Note that the following treatments are performed under control of the controller 200.

First, the wafer W is transferred into the coating and developing treatment apparatus 1 (Step S1).

Specifically, for example, the wafer W is first taken out by the transfer unit 20 from the cassette C transferred into the cassette station 2 of the coating and developing treatment apparatus 1 and mounted on the stage plate 13, and transferred to the delivery unit 53 in the third block G3 in the treatment station 3.

Next, a metal-containing resist film is formed on the wafer W (Step S2).

Specifically, for example, the wafer W is transferred by the transfer unit 70 to the thermal treatment unit 40 in the second block G2 and subjected to a temperature regulation treatment. The wafer W is thereafter transferred by the transfer unit 70 to the lower anti-reflection film forming unit 31 in the first block G1, and a lower anti-reflection film is formed on the wafer W. The wafer W is thereafter transferred by the transfer unit 70 to the thermal treatment unit 40 in the second block G2, and subjected to a heat treatment. The wafer W is thereafter returned by the transfer unit 70 to the delivery unit 53 in the third block G3.

Next, the wafer W is transferred by the transfer unit 90 to the delivery unit 54 in the same third block G3. The wafer W is thereafter transferred by the transfer unit 70 to the hydrophobic treatment unit 41 in the second block G2, and subjected to a hydrophobic treatment.

The wafer W is thereafter transferred by the transfer unit 70 to the resist coating unit 32, and a metal-containing resist film is formed on the wafer W.

Subsequently, the wafer W is subjected to a PAB treatment (Step S3).

Specifically, for example, the wafer W is transferred by the transfer unit 70 to the thermal treatment unit 40 for the PAB treatment, and subjected to a PAB treatment. The wafer W is thereafter transferred by the transfer unit 70 to the delivery unit 55 in the third block G3.

Subsequently, the wafer W is transferred by the transfer unit 70 to the edge exposure unit 42, and subjected to an edge exposure treatment. The wafer W is thereafter transferred by the transfer unit 70 to the delivery unit 56 in the third block G3.

Next, the wafer W is transferred by the transfer unit 90 to the delivery unit 52, and transferred by the shuttle transfer unit 80 to the delivery unit 62 in the fourth block G4.

Next, the wafer W is subjected to an exposure treatment (Step S4).

Specifically, for example, the wafer W is transferred by the transfer unit 100 in the interface station 5 to the exposure apparatus 4, and exposed in a predetermined pattern using EUV light. The wafer W is thereafter transferred by the transfer unit 100 to the delivery unit 60 in the fourth block G4.

Subsequently, the wafer W is subjected to a precursor formation treatment of forming the exposed metal-containing resist into a precursor by heat. More specifically, the wafer W is subjected to a first heat treatment, whereby the metal-containing resist is formed into a precursor in the exposed region of the metal-containing resist film (Step S5).

Incidentally, the bonding between the metal and the ligand (organometallic complex) in the metal-containing resist is cut by EUV in the exposure treatment, whereby the metal-containing resist becomes an active state. The metal-containing resist in the active state reacts with an oxygen-containing component (for example, moisture) in the ambient atmosphere, in which an oxygen-containing group (for example, a hydroxyl group) is bonded to a portion of the metal in the metal-containing resist whose bonding with the ligand is cut, and thereby becomes a precursor. Then, the metal-containing resists formed into precursors condense together (dehydration-condense in the case where the oxygen-containing group is a hydroxyl group), and thereby become insoluble in a developing solution.

At Step S5, in the exposed region of the metal-containing resist film, only the precursor formation of the precursor formation and the condensation of the metal-containing resist is advanced but the condensation is not advanced, or the precursor formation is mainly advanced and the condensation is slightly advanced. This sufficiently advances the precursor formation of the metal-containing resist film while causing no or little condensation in the exposed region of the metal-containing resist film. The reason of the above will be explained later.

At this Step S5, specifically, the wafer W is first transferred by the transfer unit 70, for example, into the thermal treatment unit 40 for the first heat treatment, and mounted on the cooling plate 360 at the initial position via the raising and lowering pins 370. Thereafter, as illustrated in FIG. 7, the wafer W is alternately subjected to the first heat treatment (also referred to as a pre-PEB treatment) and the cooling treatment in this order.

In the first heat treatment, for example, the cooling plate 360 is first moved by the drive 363 along the rail 364 to the delivery position above the hot plate 340. Subsequently, the raising and lowering pins 350 are raised, and the wafer W is delivered to the raising and lowering pins 350. Thereafter, the cooling plate 360 is returned to the initial position. Subsequently, the upper chamber 321 is lowered and comes into contact with the lower chamber 322 to hermetically close the inside of the chamber 320. Thereafter, the raising and lowering pins 350 are lowered, and the wafer W is mounted on the hot plate 340. The wafer W is then subjected to the first heat treatment, namely, the wafer W is heated for a predetermined time by the hot plate 340. Note that during the heating of the wafer W by the hot plate 340, the treatment space S is exhausted via the exhaust port 330, whereby gas containing a metal-containing sublimate generated during the heating is recovered.

A target ultimate temperature of the wafer W (namely, a set temperature of the hot plate 340) T1 in the first heat treatment is constant, for example, at equal to or higher than 80° C. where the precursor formation is likely to advance and equal to or lower than a target ultimate temperature T2 of the wafer W in the PEB treatment where the condensation advances, preferably at 80° C. or higher and 140° C. or lower.

The treatment time of the first heat treatment is, for example, 20 seconds or more for making the temperature of the wafer W reach a temperature range of 80° C. to 140° C. and equal to or less than the treatment time of the PEB treatment.

When the cooling treatment is performed after the first heat treatment, for example, the raising and lowering pins 350 are first raised while the exhaust via the exhaust port 330 is maintained, the wafer W is delivered to the raising and lowering pins 350 and moved to the waiting position, and the upper chamber 321 is raised. Subsequently, the cooling plate 360 is moved by the drive 363 along the rail 364 to the delivery position above the hot plate 340. Subsequently, the raising and lowering pins 350 are lowered, whereby the wafer W is delivered to the cooling plate 360. Thereafter, the cooling plate 360 is returned to the initial position. The wafer W is then subjected to the cooling treatment, namely, the wafer W is cooled for a predetermined timed by the cooling plate 360. In this embodiment, the cooling treatment is performed in the state where the wafer W is supported by the cooling plate 360 constituting the mechanism for transferring the wafer W as explained above.

In this cooling treatment, the wafer W is cooled, for example, down to 50° C. or lower. This can temporarily stop the condensation of the metal-containing resist caused in the first heat treatment.

Once the treatment in the thermal treatment unit 40 for the first heat treatment is completed, the wafer W is delivered to the transfer unit 70 via the raising and lowering pins 370, and transferred out by the transfer unit 70.

Subsequently, as illustrated in FIG. 6, the wafer W is subjected to a PEB treatment as a second heat treatment, whereby the metal-containing resist formed into the precursor is condensed in the exposed region of the metal-containing resist (Step S6).

Specifically, for example, the wafer W is transferred by the transfer unit 70 to the thermal treatment unit 40 for the PEB treatment and subjected to a PEB treatment using the hot plate 340. This causes condensation while advancing no or little precursor formation in the exposed region of the metal-containing resist film where the precursor formation has been sufficiently advanced at Step S5.

A target ultimate temperature of the wafer W (namely, the set temperature of the hot plate 340) T2 in the PEB treatment is constant, for example, at 140° C. or higher and 250° C. or lower where the condensation is likely to occur. Note that the reason why the target ultimate temperature T2 is set to 250° C. or lower is that the metal-containing resist film starts to decompose if the temperature is too high. Further, the treatment time of the PEB treatment is, for example, 30 seconds or more and 180 seconds or less.

Subsequently, the wafer W is subjected to a developing treatment (Step S7)

Specifically, for example, the wafer W is transferred by the transfer unit 70 to the developing treatment unit 30 and subjected to a developing treatment, whereby a pattern of the metal-containing resist is formed on the wafer W.

The wafer W is thereafter subjected to a POST treatment (Step S8).

Specifically, for example, the wafer W is transferred by the transfer unit 70 to the thermal treatment unit 40 for the POST treatment and subjected to a POST treatment. The wafer W is thereafter transferred by the transfer unit 70 to the delivery unit 51 in the third block G3.

The wafer W is then transferred out of the coating and developing treatment apparatus 1 (Step S9).

Specifically, the wafer W is returned to the cassette C in a reverse procedure to that at Step S1.

With the above, the series of wafer treatment is completed.

Main Operation and Effect of this Embodiment

Figure 8:
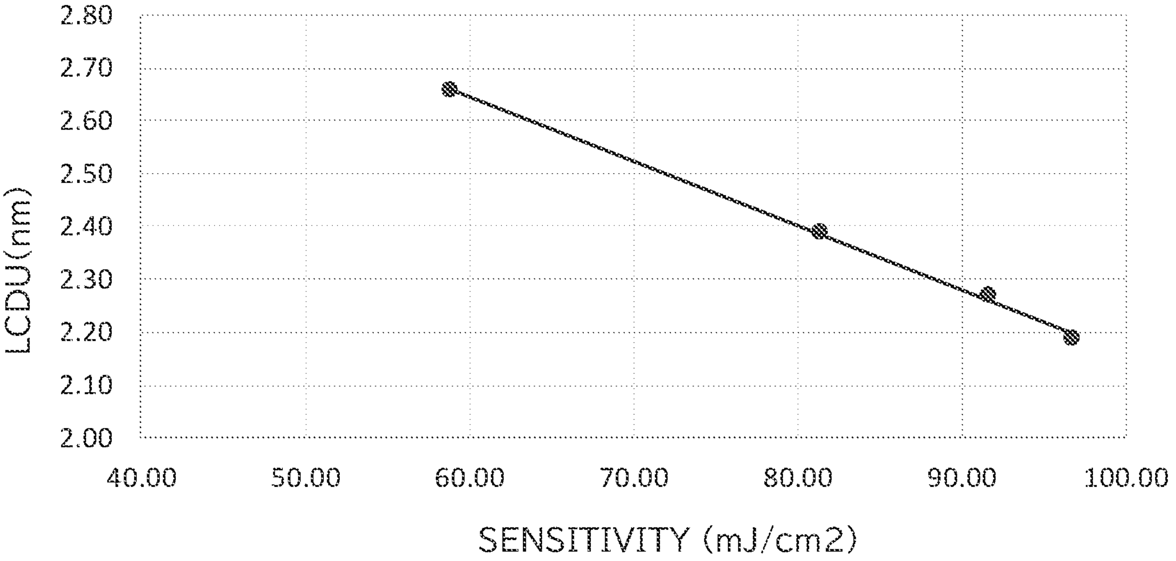
FIG. 8 is a chart illustrating the relation between the sensitivity of a metal-containing resist film and the roughness of a pattern of a metal-containing resist.
Figure 9:
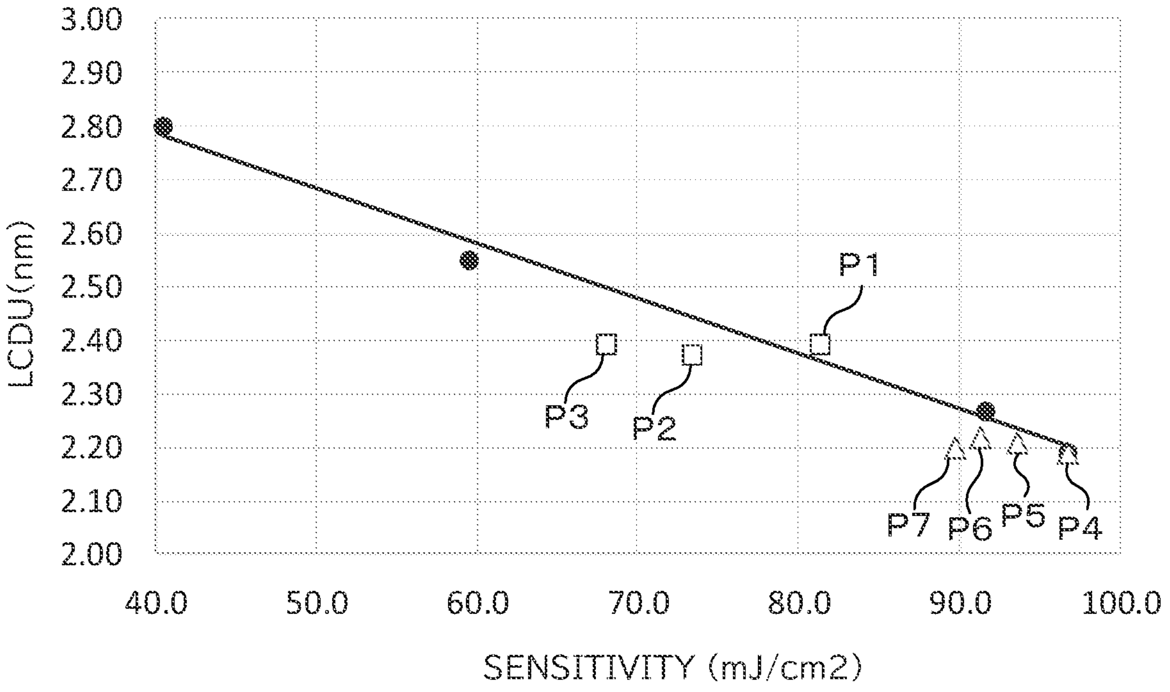
FIG. 9 is a chart illustrating the relation between the sensitivity of the metal-containing resist film and the roughness of the pattern of the metal-containing resist.
Figure 10:
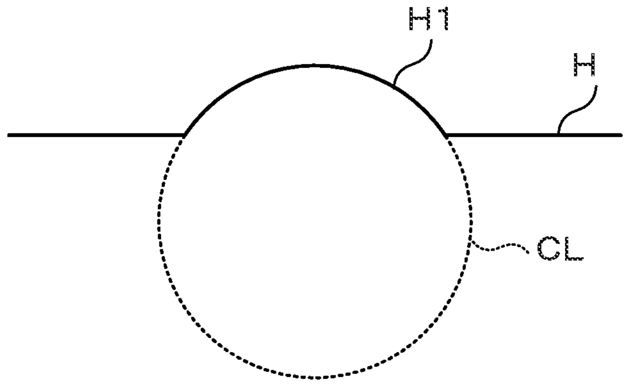
FIG. 10 is a view for explaining the reason why the roughness of the pattern of the metal-containing resist deteriorates if the time of a heat treatment is simply increased.

Main operation and effect of this embodiment will be explained using FIG. 8 to FIG. 10. FIG. 8 and FIG. 9 are charts illustrating the relation between the sensitivity of the metal-containing resist film and the roughness of the pattern of the metal-containing resist. FIG. 10 is a view for explaining the reason why the roughness of the pattern of the metal-containing resist deteriorates if the time of the heat treatment is simply increased.

Unlike this embodiment, in a form in which the wafer W is not subjected to the first heat treatment but is subjected only to the second heat treatment, namely, the PEB treatment (comparative form), the following problem arises. Specifically, as illustrated in FIG. 8, if the target ultimate temperature T2 of the wafer W in the PEB treatment is lowered in order to decrease the roughness (specifically, an LCDU (Local Critical Dimension Uniformity)) of the pattern of the metal-containing resist, the sensitivity of the metal-containing resist decreases (namely, the dose amount for obtaining a desired dimension increases). Similarly, if the time of the PEB treatment is decreased in order to decrease the roughness of the pattern of the metal-containing resist, the sensitivity of the metal-containing resist decreases. Note that the "roughness" means the roughness of the pattern of the metal-containing resist, and the "sensitivity" means the sensitivity of the metal-containing resist in the following.

In this regard, the present inventors carried out experiments of performing the heat treatment under following conditions P1 to P7 on the wafer W. Note that the target ultimate temperature, namely, the set temperature of the hot plate 340 was set constant.

Condition P1: One time of a heat treatment at a target ultimate temperature of 160° C. and for a treatment time of 60 seconds.

Condition P2: One time of a heat treatment at a target ultimate temperature of 160° C. and for a treatment time of 30 seconds. Thereafter, one time of a heat treatment at a target ultimate temperature of 160° C. and for a treatment time of 60 seconds.

Condition P3: Two times of a heat treatment at a target ultimate temperature of 160° C. and for a treatment time of 60 seconds.

Condition P4: One time of a heat treatment at a target ultimate temperature of 120° C. and for a treatment time of 60 seconds.

Condition P5: Two times of a heat treatment at a target ultimate temperature of 120° C. and for a treatment time of 60 seconds.

Condition P6: Three times of a heat treatment at a target ultimate temperature of 120° C. and for a treatment time of 60 seconds.

Condition P7: Four times of a heat treatment at a target ultimate temperature of 120° C. and for a treatment time of 60 seconds.

Further, in each of the conditions P2, P3, P5 to P7, the cooling treatment was performed on the wafer W between the heat treatment and the heat treatment to cool the wafer W down to room temperature.

In the experiments, as illustrated in FIG. 9, the roughness under the condition P4 in which the treatment time and the number of times of treatment were the same as those in the condition P1 and the target ultimate temperature was lower than that in the condition P1 was smaller than that under the condition P1 and the sensitivity decreased. However, if the heat treatment as that under the condition P4 was repeatedly performed, the sensitivity improved according to the number of times of the treatment while keeping the roughness under the condition P4 as is clear from the results of the conditions P4 to P7. Similarly, if the heat treatment having the same target ultimate temperature as that in the condition P1 was repeatedly performed in order to increase the total heat applied to the wafer W, the sensitivity improved according to the total heat of the wafer W while keeping the roughness under the condition P1 as is clear from the results of the conditions P1 to P3.

The results of the experiments show that though the total heat applied to the wafer W through the whole heat treatment influences the sensitivity, not the total heat but the initial target ultimate temperature in the whole heat treatment greatly influences the roughness. Note that considering that the initial target ultimate temperature, namely, the initial set temperature of the hot plate 340 corresponds to the initial heating rate of the wafer W, the point shown by the above results of the experiments is that though the total heat influences the sensitivity, the initial heating rate of the wafer W in the whole heat treatment greatly influences the roughness. In other words, based on the results of the experiments, the roughness can be improved while suppressing the deterioration in sensitivity by considering the heating rate while applying sufficient total heat.

The conceivable reason why the initial target ultimate temperature of the wafer W and the heating rate of the wafer W in the heat treatment greatly influence the roughness is as follows (note that the number of times of the heat treatment performed on the wafer W after the exposure here is assumed to be one).

More specifically, in the exposed region of the metal-containing resist film, the metal-containing resist is formed into a precursor as explained above, and then condensed. Further, if all of the metal-containing resist is formed into a precursor in the exposed region of the metal-containing resist film before start of the heat treatment, the reaction occurring by the heat treatment is only condensation. However, before start of the heat treatment, all of the metal-containing resist is not formed into a precursor in the exposed region of the metal-containing resist film but only a part of the metal-containing resist is formed into a precursor.

Therefore, once the heat treatment is started, the precursor formation of the metal-containing resist occurs in the exposed region of the metal-containing resist film. However, if the initial target ultimate temperature of the wafer W is high and the heating rate of the wafer W is high in the heat treatment, the precursor formation of the metal-containing resist does not sufficiently occur by the time when the temperature of the wafer W is maintained at a temperature where the condensation of the metal-containing resist occurs in the heat treatment, resulting in that both the reactions in the following reaction passes (A), (B) can occur.

(A) condensation of the metal-containing resist formed into a precursor (B) precursor formation of the metal-containing resist→then, condensation of the metal-containing resist formed into a precursor Accordingly, the rate of the reaction in the reaction pass of (B) is low (namely, the time required for the reaction to complete is long), so that portions where the reaction advances in the reaction pass of (B) are insufficient in condensation and removed when a developing treatment is performed, to form convex portions.

Besides, if the time of the heat treatment is increased in order to make the condensation of the portions where the reaction advances in the reaction pass of (B) sufficient, the roughness deteriorates as follows. More specifically, portions where the reaction advances in the reaction pass of (A) form clusters (namely, particles), and if the reaction is continued, the cluster diameter continues to increase. Then, if the time of the heat treatment is increased in order to make the condensation of the portions where the reaction advances in the reaction pass of (B) sufficient and the reaction in the reaction pass of (A), namely, the condensation is continued, a part of a cluster CL with a large diameter forms a convex portion H1 largely projecting from a surface H of the pattern of the metal-containing resist as illustrated in FIG. 10, resulting in deterioration in roughness.

The above is the reason why the initial target ultimate temperature of the wafer W and the heating rate of the wafer W in the heat treatment greatly influence the roughness.

Based on the above, in this embodiment, the first heat treatment is performed on the wafer W on which the metal-containing resist film has been formed and subjected to the exposure treatment, whereby the metal-containing resist is formed into the precursor in the exposed region of the metal-containing resist film at Step S5 as explained above. This sufficiently advances the precursor formation of the metal-containing resist while causing no or little condensation in the exposed region of the metal-containing resist film. Then, at subsequent Step S6, the heat treatment is performed on the wafer W, whereby the metal-containing resist which has been formed into the precursor is condensed in the exposed region of the metal-containing resist film. This causes condensation while advancing no or little precursor formation in the exposed region of the metal-containing resist film where the precursor formation has been sufficiently advanced at Step S5.

In other words, in this embodiment, the precursor formation is sufficiently advanced before a stage of condensing the metal-containing resist which has been formed into the precursor in the exposed region of the metal-containing resist film, so that there are few portions where the reaction in the reaction pass of (B) advances at the stage of the above condensation. Further, there is no need to increase the time of the heat treatment in order to make the condensation sufficient at the portions where the reaction in the reaction pass of (B) advances. Therefore, according to this embodiment, the roughness of the pattern of the metal-containing resist can be improved. Further, according to this embodiment, by adjusting at least one of the time for performing the first heat treatment and the time for performing the second heat treatment to apply sufficient heat to the wafer W by the heat treatment after exposure and before development, the sensitivity of the metal-containing resist can be secured. In short, according to this embodiment, it is possible to improve the roughness of the pattern surface of the metal-containing resist while suppressing a decrease in sensitivity of the coating film of the metal-containing resist.

Further, in this embodiment, the first heat treatment and the cooling treatment are alternately repeatedly performed on the wafer W at step S5 of forming the metal-containing resist into a precursor in the exposed region of the metal-containing resist film. Therefore, even when the condensation occurs in the first heat treatment, the cooling treatment temporarily stops the condensation, so that it is possible to suppress an enlargement of the clusters due to the continuation of the condensation as explained using FIG. 10. Accordingly, it is possible to further improve the roughness of the pattern of the metal-containing resist.

<Another Example of the Precursor Formation Treatment>

In the above example, when forming the metal-containing resist into the precursor in the exposed region of the metal-containing resist film at Step S5, the first heat treatment and the cooling treatment are alternately repeatedly performed on the wafer W, and a final cooling treatment is performed by the thermal treatment unit 40 for performing the first heat treatment. The final cooling treatment may be performed by the thermal treatment unit 40 for performing the PEB treatment as the second heat treatment.

Further, when the precursor formation is performed at Step S5, the first heat treatment and the cooling treatment may be performed one time each in this order on the wafer W instead of alternately repeatedly performing the first heat treatment and the cooling treatment on the wafer W.

Further, the cooling treatment may be omitted in both the case where the first heat treatment is performed a plurality of times and the case where the first heat treatment is performed one time.

Figure 11:
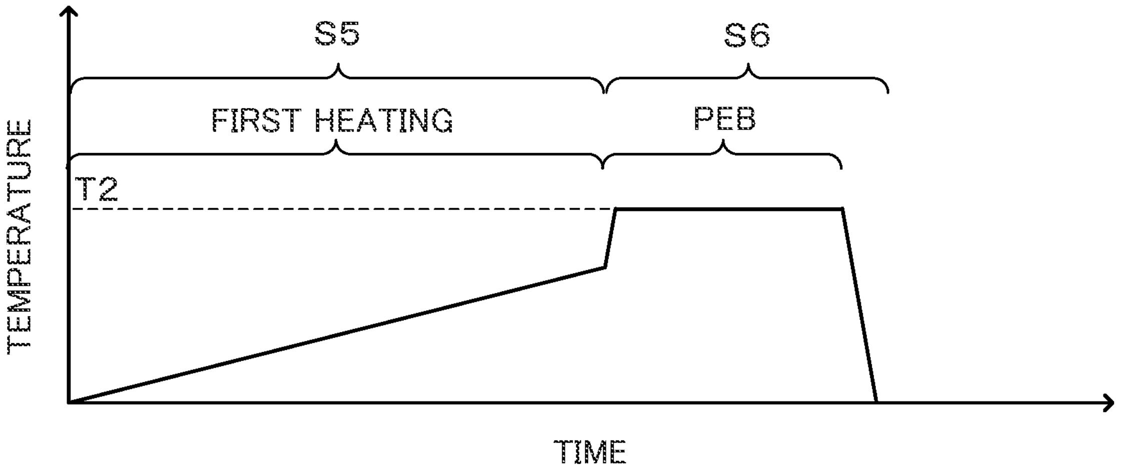
FIG. 11 is a chart for explaining another example of a precursor formation treatment.

Besides, when the precursor formation is performed at Step S5 as illustrated in FIG. 11, the target ultimate temperature of the wafer W in the first heat treatment may be continuously increased. In the case of this example, the target ultimate temperature of the wafer W in the first heat treatment is set such that the temperature increase rate of the wafer W is lower than that at the start of the treatment when the target temperature of the wafer W in the first heat treatment is made equal to the target ultimate temperature of the wafer W in the PEB treatment as the second heat treatment. Specifically, in the case of this example, the average increase rate of the target ultimate temperature of the wafer W in the first heat treatment is set to 6° C./s or less. Further, in this example, the final target ultimate temperature of the wafer W in the first heat treatment is equal to or lower than the target ultimate temperature of the wafer W in the PEB treatment.

Figure 12:
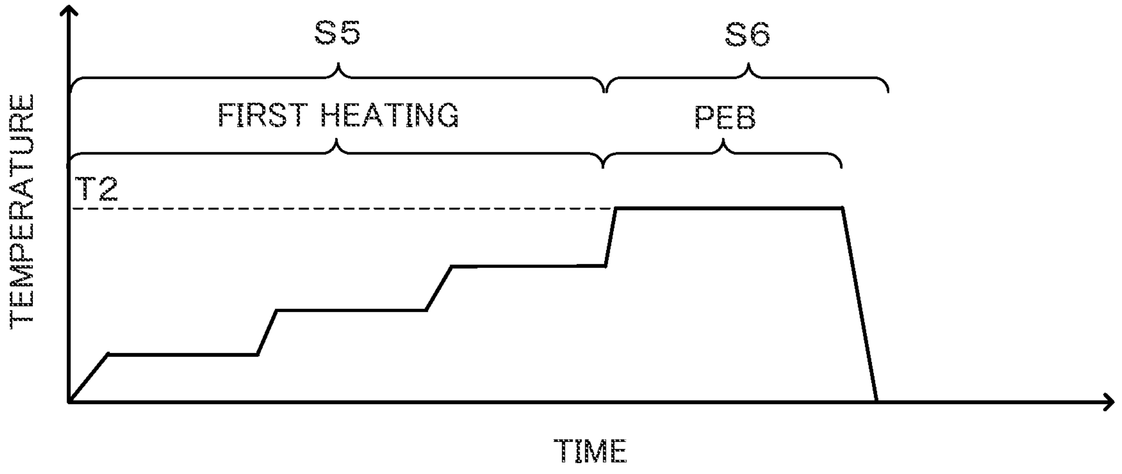
FIG. 12 is a chart for explaining another example of the precursor formation treatment.

Besides, when the precursor formation is performed at Step S5 as illustrated in FIG. 12, the target ultimate temperature of the wafer W in the first heat treatment may be increased in stages. Also in the case of this example, the target ultimate temperature of the wafer W in the first heat treatment is set such that the average temperature increase rate of the wafer W is lower than that at the start of the treatment when the target temperature of the wafer W in the first heat treatment is made constant and equal to the target temperature of the wafer W in the PEB treatment as the second heat treatment. Specifically, the average increase rate of the target ultimate temperature of the wafer W in the first heat treatment is set to 6° C./s or less also in the case of this example. Further, the final target ultimate temperature of the wafer W in the first heat treatment is equal to or lower than the target ultimate temperature of the wafer W in the PEB treatment also in the case of this example.

Besides, in the case where the target ultimate temperature of the wafer W in the first heat treatment is continuously increased and in the case where the target ultimate temperature of the wafer W is increased in stages in the first heat treatment when the precursor formation is performed at Step S5, the number of times of the first heat treatment may be one, the cooling treatment may be omitted, and the PEB treatment may be performed subsequent to the first heat treatment.

The first heat treatment and the PEB treatment are performed in separate thermal treatment units 40 in the above example, but may be performed using a common thermal treatment unit 40 and a common hot plate 340. In particular, in the case where the target ultimate temperatures of the wafer W, namely, the set temperatures of the hot plates 340 are equal to each other between the first heat treatment and the PEB treatment and constant, in the case where cooling treatment is omitted and the PEB treatment is performed subsequent to the first heat treatment, and so on, the same thermal treatment unit 40 may be used for the first heat treatment and the second heat treatment.

<Another Example of the Thermal Treatment Unit>

Besides, the heating part for performing the first heat treatment and the cooling part for performing the cooling treatment are integrated in the above example, but may be separate bodies.

Further, the heating part for performing the first heat treatment and the cooling part for performing the cooling treatment are integrated in the above example, whereas the heating part for performing the PEB treatment is a separate body in the above example. In place of the above, three of the heating part for performing the first heat treatment, the cooling part for performing the cooling treatment, and the heating part for performing the PEB treatment may be integrated. Specifically, the hot plate for the first heat treatment, the hot plate for the PEB treatment, and the cooling plate for the cooling treatment may be provided in a common housing in the thermal treatment unit.

In this case, the cooling part for performing the cooling treatment, the heating part for performing the first heat treatment, and the heating part for performing the PEB treatment may be arranged in this order along the X-direction in which the wafer transfer region D extends. Besides, the cooling part for performing the cooling treatment, the heating part for performing the first heat treatment, and the heating part for performing the PEB treatment may be arranged in order from the wafer transfer region D side along the Y-direction orthogonal to the X-direction within a horizontal plane.

Further, in this case, the cooling plate for the cooling treatment may constitute a transfer mechanism, and the transfer of the wafer W to the hot plate for the first heat treatment and the hot plate for the PEB treatment may be performed via the cooling plate. Besides, a transfer mechanism may be provided in the housing separately from the cooling plate for the cooling treatment, and the transfer mechanism may transfer the wafer W to the hot plate for the first heat treatment, the hot plate for the PEB treatment, and the cooling plate for the cooling treatment.

<Another Example of the Heating Region where the First Heat Treatment is Performed>

Figure 13:
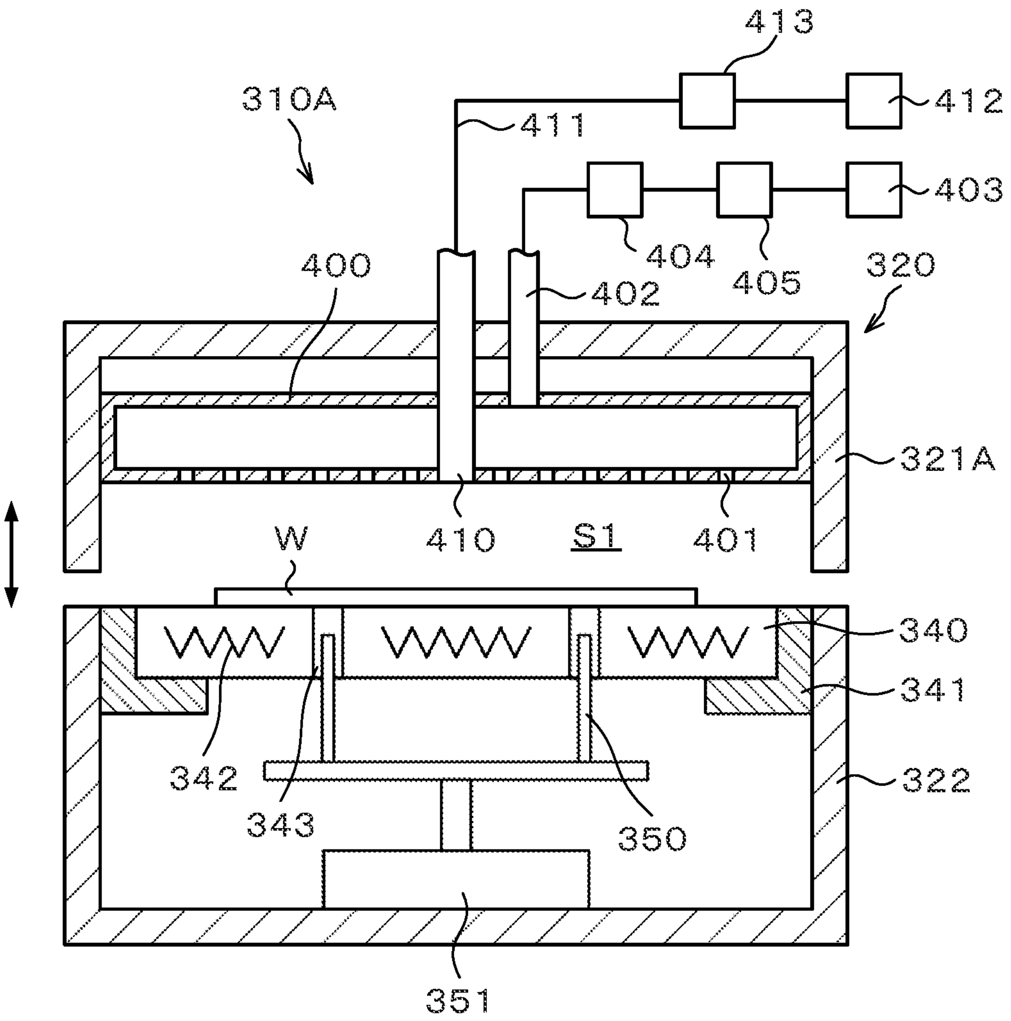
FIG. 13 is a longitudinal sectional view schematically illustrating another example of a heating region where the first heat treatment is performed.

FIG. 13 is a longitudinal sectional view schematically illustrating another example of the heating region where the first heat treatment is performed.

In a heating region 310A in FIG. 13, a shower head 400 as a gas discharger which discharges gas (hereinafter, referred to as a precursor forming gas) for promoting the precursor formation to the space S is provided inside an upper chamber 321A and at a position facing the hot plate 340. The precursor forming gas is concretely gas for promoting the change to a precursor containing metal and oxygen and, more concretely, gas containing moisture, namely, moisture-containing gas, oxygen gas, carbon dioxide gas, or a combination of two or more of them. In the case of using the moisture-containing gas, gas with a moisture concentration of, for example, 20% to 80% is used.

The shower head 400 concretely discharges the precursor forming gas toward the wafer W supported on the hot plate 340. Further, the shower head 400 is configured to freely rise and lower in synchronization with the upper chamber 321A.

A lower surface of the shower head 400 is formed with a plurality of gas supply holes 401. The plurality of gas supply holes 401 are arranged uniformly at a portion other than a later-explained central exhaust path 410 at the lower surface of the shower head 400. To the shower head 400, a gas supply pipe 402 is connected. Further, to the gas supply pipe 402, a gas supply source 403 which supplies the precursor forming gas to the shower head 400 is connected. Further, the gas supply pipe 402 is provided with a supply equipment group 404 including a valve for controlling the flow of the precursor forming gas, a flow regulator valve, and so on, and a temperature regulating mechanism 405 for regulating the temperature of the precursor forming gas to a predetermined range (for example, 20° C. to 50° C.).

Further, the shower head 400 is provided with the central exhaust path 410 as an exhauster which exhausts the treatment space S. The central exhaust path 410 is formed in a manner to extend from a central portion of the lower surface to a central portion of the upper surface of the shower head 400. To the central exhaust path 410, a central exhaust pipe 411 provided at the central portion of the upper surface of the upper chamber 321A is connected. Further, to the central exhaust pipe 411, an exhaust apparatus 412 such as a vacuum pump is connected. Further, the central exhaust pipe 411 is provided with an exhaust equipment group 413 having a valve and so on for controlling the flow of exhausted gas. The central exhaust path 410 can exhaust the treatment space S from above the center of the wafer W supported on the hot plate 340.

In the case of employing the heating region 310A in FIG. 13, the first heat treatment may be performed on the wafer W in an atmosphere of the precursor forming gas discharged from the gas supply holes 401. This can further promote the precursor formation in the first heat treatment.

Similarly, gas supply holes may be provided in the cooling region 311 where the cooling treatment is performed in the precursor formation at Step S5, and the cooling treatment may be performed on the wafer W in an atmosphere of the precursor forming gas discharged from the gas supply holes.

<Example of the Heating Part for Performing the PEB Treatment>

Figure 14:
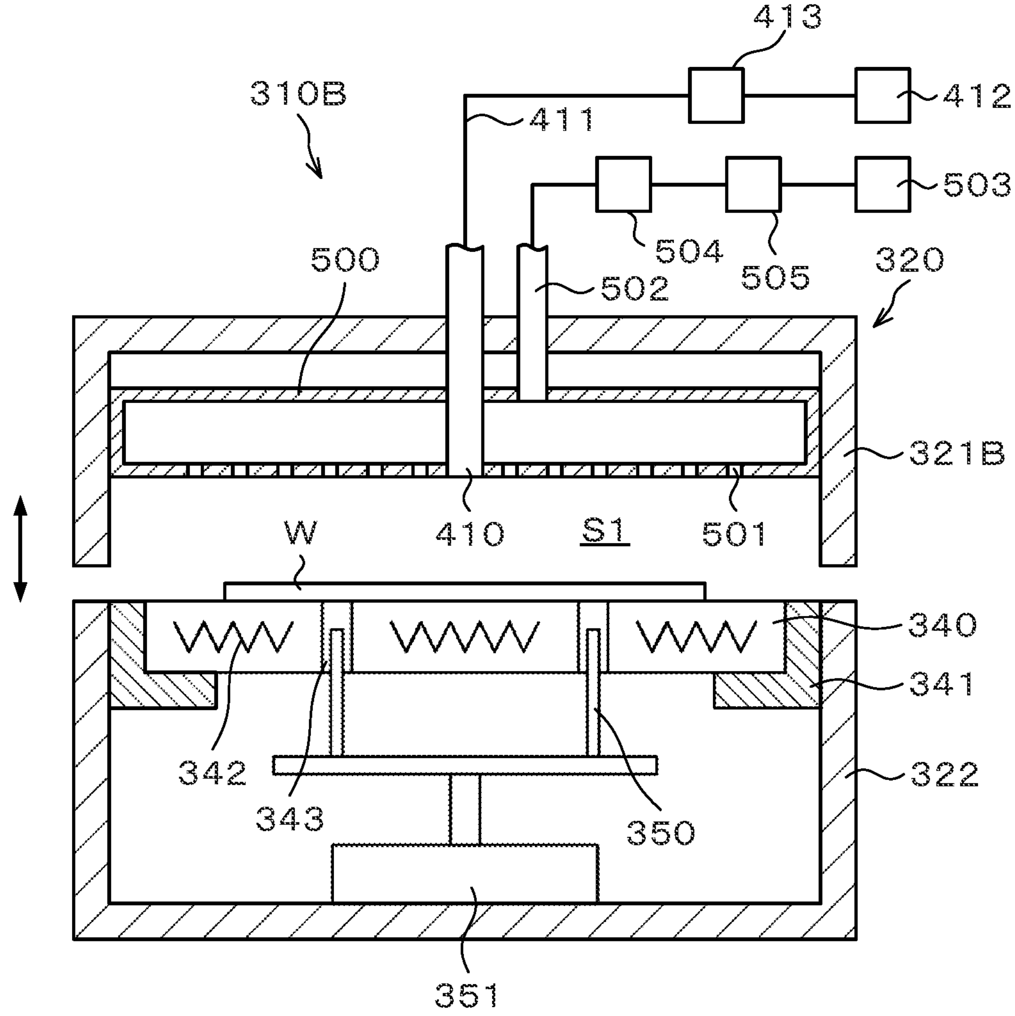
FIG. 14 is a longitudinal sectional view schematically illustrating an example of the heating region where a PEB treatment is performed.

FIG. 14 is a longitudinal sectional view schematically illustrating an example of the heating region where the PEB treatment is performed.

In a heating region 310B in FIG. 14, a shower head 500 as another gas discharger which discharges gas (hereinafter, a condensation promoting gas) for promoting the condensation while suppressing the precursor formation to the space S is provided inside an upper chamber 321B and at a position facing the hot plate 340. The condensation promoting gas is concretely gas containing no or little moisture and, more concretely, dry air, inert gas (for example, nitrogen gas), or a mixed gas of them.

The shower head 500 concretely discharges the condensation promoting gas toward the wafer W supported on the hot plate 340. Further, the shower head 500 is configured to freely rise and lower in synchronization with the upper chamber 321B.

A lower surface of the shower head 500 is formed with a plurality of gas supply holes 501. The plurality of gas supply holes 501 are arranged uniformly at a portion other than the central exhaust path 410 at the lower surface of the shower head 500. To the shower head 500, a gas supply pipe 502 is connected. Further, to the gas supply pipe 502, a gas supply source 503 which supplies the condensation promoting gas to the shower head 500 is connected. Further, the gas supply pipe 502 is provided with a supply equipment group 504 including a valve for controlling the flow of the condensation promoting gas, a flow regulator valve, and so on, and a temperature regulating mechanism 505 for regulating the temperature of the condensation promoting gas to a predetermined range.

In the case of employing the heating region 310B in FIG. 14, the PEB treatment may be performed on the wafer W in an atmosphere of the condensation promoting gas discharged from the gas supply holes 501. This can further promote the condensation while suppressing the precursor formation in the PEB treatment.

The embodiments disclosed herein are examples in all respects and should not be considered to be restrictive. Various omissions, substitutions and changes may be made in the embodiments without departing from the scope and spirit of the attached claims. For example, configuration requirements of the above embodiments can be arbitrarily combined. The operations and effects about the configuration requirements relating to the combination can be obtained as a matter of course from the arbitrary combination, and those skilled in the art can obtain clear other operations and effects from the description herein.

The effects described herein are merely explanatory or illustrative in all respects and not restrictive. The technique relating to this disclosure can offer other clear effects to those skilled in the art from the description herein in addition to or in place of the above effects.

Note that the following configuration examples also belong to the technical scope of this disclosure.

(1) A substrate treatment method including:
- performing a first heat treatment on a substrate on which a coating film of a metal-containing resist has been formed and subjected to an exposure treatment, to form the metal-containing resist into a precursor in an exposed region of the coating film;
- thereafter, performing a second heat treatment on the substrate to condense the metal-containing resist formed into the precursor in the exposed region of the coating film; and
- thereafter, performing a developing treatment on the substrate.

(2) The substrate treatment method according to the (1), wherein
- a final target ultimate temperature of the substrate in the first heat treatment is 80° C. or higher.

(3) The substrate treatment method according to the (1) or (2), wherein
- in the forming the precursor, a cooling treatment is performed on the substrate after the first heat treatment is performed.

(4) The substrate treatment method according to the (3), wherein
- in the forming the precursor, the first heat treatment and the cooling treatment are alternately repeatedly performed on the substrate.

(5) The substrate treatment method according to the (3) or (4), wherein
- in the forming the precursor, the cooling treatment on the substrate is performed with the substrate supported by a transfer mechanism configured to transfer the substrate.

(6) The substrate treatment method according to any one of the (1) to (5), wherein
- a target ultimate temperature of the substrate in the first heat treatment is continuously increased.

(7) The substrate treatment method according to any one of the (1) to (5), wherein
- a target ultimate temperature of the substrate in the first heat treatment is increased in stages.

(8) The substrate treatment method according to the (6) or (7), wherein
- an average increase rate of the target ultimate temperature of the substrate in the first heat treatment is 6° C./s or less.

(9) The substrate treatment method according to any one of the (1) to (8), wherein
- in the forming the precursor, a treatment is performed on the substrate in an atmosphere of gas which promotes the precursor formation.

(10) The substrate treatment method according to any one of the (1) to (9), wherein in the condensing, a treatment is performed on the substrate in an atmosphere of gas which promotes the condensation while suppressing the precursor formation.

(11) A substrate treatment apparatus for treating a substrate, including:

a heating part configured to perform a heat treatment on the substrate;

a developing part configured to perform a developing treatment on the substrate; and a controller, wherein the controller performs control to cause the substrate treatment apparatus to execute:

performing a first heat treatment on the substrate on which a coating film of a metal-containing resist has been formed and subjected to an exposure treatment, to form the metal-containing resist into a precursor in an exposed region of the coating film;

thereafter, performing a second heat treatment on the substrate to condense the metal-containing resist formed into the precursor in the exposed region of the coating film; and thereafter, performing a developing treatment on the substrate.

(12) A computer-readable storage medium storing a program running on a computer of a controller which controls a substrate treatment apparatus to cause the substrate treatment apparatus to execute a substrate treatment method for treating a substrate, the substrate treatment method including:

performing a first heat treatment on the substrate on which a coating film of a metal-containing resist has been formed and subjected to an exposure treatment, to form the metal-containing resist into a precursor in an exposed region of the coating film;

thereafter, performing a second heat treatment on the substrate to condense the metal-containing resist formed into the precursor in the exposed region of the coating film; and thereafter, performing a developing treatment on the substrate.

According to this disclosure, it is possible to improve the roughness of a pattern of a metal-containing resist while suppressing a decrease in sensitivity of a coating film of the metal-containing resist.

What is claimed is:

1. A substrate treatment method comprising:

performing a first heat treatment on a substrate on which a coating film of a metal-containing resist has been formed and subjected to an exposure treatment, to form the metal-containing resist into a precursor in an exposed region of the coating film;

thereafter, performing a second heat treatment on the substrate to condense the metal-containing resist formed into the precursor in the exposed region of the coating film; and thereafter, performing a developing treatment on the substrate.

2. The substrate treatment method according to claim 1, wherein a final target ultimate temperature of the substrate in the first heat treatment is 80° C. or higher.

3. The substrate treatment method according to claim 1, wherein in the forming the precursor, a cooling treatment is performed on the substrate after the first heat treatment is performed.

4. The substrate treatment method according to claim 3, wherein in the forming the precursor, the first heat treatment and the cooling treatment are alternately repeatedly performed on the substrate.

5. The substrate treatment method according to claim 3, wherein in the forming the precursor, the cooling treatment on the substrate is performed with the substrate supported by a transfer mechanism configured to transfer the substrate.

6. The substrate treatment method according to claim 1, wherein a target ultimate temperature of the substrate in the first heat treatment is continuously increased.

7. The substrate treatment method according to claim 1, wherein a target ultimate temperature of the substrate in the first heat treatment is increased in stages.

8. The substrate treatment method according to claim 6, wherein an average increase rate of the target ultimate temperature of the substrate in the first heat treatment is 6° C./s or less.

9. The substrate treatment method according to claim 1, wherein in the forming the precursor, a treatment is performed on the substrate in an atmosphere of gas which promotes the precursor formation.

10. The substrate treatment method according to claim 1, wherein in the condensing, a treatment is performed on the substrate in an atmosphere of gas which promotes the condensation while suppressing the precursor formation.

* * * * *